(12) United States Patent
Lee et al.

(10) Patent No.: US 7,563,753 B2
(45) Date of Patent: Jul. 21, 2009

(54) CLEANING SOLUTION FOR REMOVING PHOTORESIST

(75) Inventors: Geun Su Lee, Kyoungki-do (KR); Jae Chang Jung, Seoul (KR); Ki Soo Shin, Kyoungki-do (KR); Keun Kyu Kong, Kyongki-do (KR); Sung Koo Lee, Seoul (KR); Young Sun Hwang, Kyoungki-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 550 days.

(21) Appl. No.: 10/317,578

(22) Filed: Dec. 12, 2002

(65) Prior Publication Data

US 2003/0130148 A1 Jul. 10, 2003

(30) Foreign Application Priority Data

| Dec. 12, 2001 | (KR) | ................................ | 2001-78470 |
| Dec. 14, 2001 | (KR) | ................................ | 2001-79354 |
| Dec. 14, 2001 | (KR) | ................................ | 2001-79355 |
| Dec. 18, 2001 | (KR) | ................................ | 2001-80572 |
| Dec. 18, 2001 | (KR) | ................................ | 2001-80573 |
| Dec. 18, 2001 | (KR) | ................................ | 2001-80574 |
| Dec. 18, 2001 | (KR) | ................................ | 2001-80575 |

(51) Int. Cl.
*C11D 7/50* (2006.01)

(52) U.S. Cl. ........................................ 510/175; 134/1.3

(58) Field of Classification Search ................ 510/175, 510/176; 134/1.3, 2, 3
See application file for complete search history.

(56) References Cited

U.S. PATENT DOCUMENTS 3,962,119 A * 6/1976 Cosentino et al. ............. 516/55

(Continued)

FOREIGN PATENT DOCUMENTS

KR  10-2000-0046480  7/2000

(Continued)

OTHER PUBLICATIONS

Office action in corresponding Korean Application No. 2001-78470 dated Dec. 28, 2005.

(Continued)

*Primary Examiner*—Gregory E Webb
(74) *Attorney, Agent, or Firm*—Marshall, Gerstein & Borun LLP

(57) ABSTRACT

Cleaning solutions for removing photoresist resins and a method of forming patterns using the same are disclosed. The cleaning solution includes water ($H_2O$) as main component, one or more surfactants as additive selected from the group consisting of polyoxyalkylene compounds, a salt of alcohol amine of Formula 1 and hydrocarbon compounds having carboxylic acid (—COOH) group, a salt of alcohol amine of Formula 1 and hydrocarbon compounds having sulfonic acid (—$SO_3H$) group, polyethylene glycol compounds, compounds of Formula 3, compounds having a molecular weight ranging from 1000 to 10000 including repeating unit of Formula 4, polyether denatured silicon compounds and alcohol compounds.

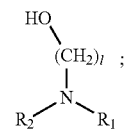

Formula 1

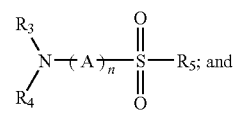

Formula 3

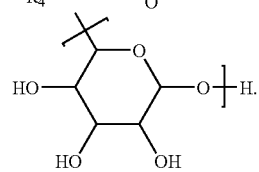

Formula 4 wherein $R_1$, $R_2$, $R_3$, $R_4$, $R_5$, A, l and n are defined in the specification.

15 Claims, 17 Drawing Sheets

U.S. PATENT DOCUMENTS

| | | | | |
|---|---|---|---|---|
| 4,013,579 | A | * | 3/1977 | Nakasone et al. ............ 510/405 |
| 4,239,661 | A | * | 12/1980 | Muraoka et al. ............ 438/471 |
| 4,298,490 | A | * | 11/1981 | Lange et al. ................ 510/326 |
| 4,364,837 | A | * | 12/1982 | Pader ........................ 510/121 |
| 4,374,036 | A | * | 2/1983 | Canale et al. ............... 510/172 |
| 4,424,241 | A | * | 1/1984 | Abys ...................... 427/443.1 |
| 4,443,355 | A | * | 4/1984 | Murata et al. ............... 510/320 |
| 4,518,517 | A | * | 5/1985 | Eigen et al. ................. 510/131 |
| 4,587,030 | A | * | 5/1986 | Casey ........................ 510/406 |
| 4,595,519 | A | * | 6/1986 | Takeno et al. .............. 252/79.1 |
| 4,661,340 | A | * | 4/1987 | Nagy nee Kricsfalussy et al. ............................ 424/47 |
| 4,897,215 | A | * | 1/1990 | Trieselt et al. ............. 510/360 |
| 4,915,864 | A | * | 4/1990 | Kita et al. ................... 510/535 |
| 4,976,885 | A | * | 12/1990 | Wisotzki et al. ............ 510/432 |
| 5,102,777 | A | * | 4/1992 | Lin et al. .................... 510/176 |
| 5,174,816 | A |   | 12/1992 | Aoyama et al. |
| 5,417,877 | A | * | 5/1995 | Ward ........................ 510/176 |
| 5,482,566 | A | * | 1/1996 | Lee ............................ 134/42 |
| 5,482,645 | A | * | 1/1996 | Maruyama et al. ......... 510/407 |
| 5,496,491 | A | * | 3/1996 | Ward et al. ................. 510/176 |
| 5,567,574 | A | * | 10/1996 | Hasemi et al. .............. 430/331 |
| 5,759,973 | A | * | 6/1998 | Honda et al. ............... 510/176 |
| 5,968,848 | A | * | 10/1999 | Tanabe et al. .............. 438/745 |
| 5,972,862 | A | * | 10/1999 | Torii et al. .................. 510/175 |
| 6,117,220 | A | * | 9/2000 | Kodama et al. ............... 106/3 |
| 6,413,923 | B2 | * | 7/2002 | Honda et al. ................ 510/175 |
| 6,420,327 | B1 | * | 7/2002 | Machac et al. .............. 510/201 |
| 6,451,510 | B1 |   | 9/2002 | Messick et al. |
| 6,458,517 | B2 | * | 10/2002 | Nohara et al. ............... 430/329 |
| 6,602,117 | B1 | * | 8/2003 | Chopra et al. ................. 451/65 |
| 6,602,351 | B2 | * | 8/2003 | DeYoung et al. ............. 134/36 |
| 7,202,200 | B1 | * | 4/2007 | DeLeo et al. ............... 510/191 |
| 2002/0086167 | A1 | * | 7/2002 | Hayashi et al. ............. 428/447 |
| 2003/0096725 | A1 | * | 5/2003 | Tsibouklis et al. .......... 510/421 |
| 2004/0065022 | A1 | * | 4/2004 | Machii et al. ................ 51/309 |

FOREIGN PATENT DOCUMENTS

| | | |
|---|---|---|
| KR | 2002-0094164 A | 12/2002 |
| WO | WO 99/45443 | 9/1999 |
| WO | WO 00/03306 | 1/2000 |

OTHER PUBLICATIONS

Korean-language Official Action dated Apr. 27, 2007, issued by the Korean Intellectual Property Office, in connection with the Korean counterpart priority application No. 10-2001-0080572.

Korean-language Official Action dated Apr. 27, 2007, issued by the Korean Intellectual Property Office, in connection with the Korean counterpart priority application No. 10-2001-0080574.

Korean-language Official Action dated Apr. 27, 2007, issued by the Korean Intellectual Property Office, in connection with the Korean counterpart priority application No. 10-2001-0080575.

* cited by examiner

CLEANING SOLUTION FOR REMOVING PHOTORESIST

BACKGROUND

1. Technical Field

A cleaning solution is disclosed for removing photoresist resins used in cleaning semiconductor substrates during the last process after development. More specifically, a cleaning solution for removing photoresist is disclosed that comprises water ($H_2O$) as main component, one or more surfactants as additive selected from the group consisting of polyoxyalkylene compounds, a salt of alcohol amine of Formula 1 and hydrocarbon compounds having carboxylic acid (—COOH) group, a salt of alcohol amine of Formula 1 and hydrocarbon compounds having sulfonic acid (—$SO_3H$) group, polyethylene glycol compounds, compounds of Formula 3, compounds having a molecular weight ranging from 1000 to 10000 including repeating unit of Formula 4 and polyether denatured silicon compounds and alcohol compounds.

2. Description of the Related Art

As devices are getting minute, photoresist patterns have a higher aspect ratio (i.e. the ratio of the thickness of photoresist, or height to the linewidth of formed pattern).

When the height of formed photoresist patterns goes beyond critical height, capillary force exceeds elasticity of photoresist, thereby resulting in erosion of patterns during a cleaning process In order to overcome this problem, adhesive force between underlying layers and photoresist is enhanced by increasing inner elasticity of photoresist or decreasing surface tension thereof.

Generally, a method of forming photoresist patterns on semiconductor substrates comprises the steps of:

forming an underlying layer on a semiconductor substrate;
forming a photoresist film on the underlying layer; and
forming a photoresist pattern by exposing a portion of the underlying layer using exposing and developing processes.

Here, in case of a positive photoresist film, a photoresist film of an exposing region is removed by developer and then a photoresist pattern is formed.

As described above, after the photoresist pattern is developed, the remaining photoresist film on the semiconductor substrate is removed by dispersing distilled water to the semiconductor substrate from a top portion of spin device. Here, the pattern is eroded due to high surface tension of distilled water.

The conventional cleaning solution comprised anion surfactant in order to prevent the collapse of photoresist patterns having high aspect ratio. For example, U.S. Pat. No. 6,451,565 describes that the cleaning solution included anion surfactant having fluorine and deionized water to prevent the collapse of such patterns

SUMMARY OF THE DISCLOSURE

A cleaning solution for removing photoresist material is disclosed which decrease surface tension to prevent the collapse of photoresist patterns.

A method of forming photoresist patterns is also disclosed which uses the disclosed cleaning solution for removing photoresist material.

A semiconductor device produced by using the above-described method is also disclosed.

DETAILED DESCRIPTION OF THE PRESENTLY PREFERRED EMBODIMENTS

Figure 1:
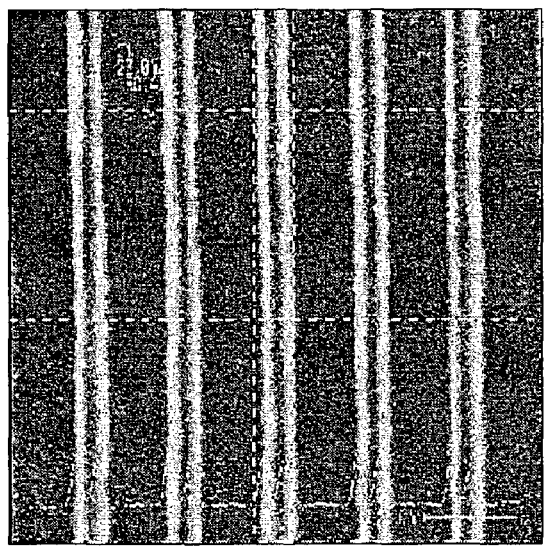
FIGS. 1 through 15 are photographs of photoresist patterns obtained from Examples 32 through 46.

A disclosed cleaning solution for removing photoresist material comprises water ($H_2O$) as main component and one or more surfactants as additive selected from the group consisting of polyoxyalkylene compounds, a salt of alcohol amine of Formula 1 and hydrocarbon compounds having carboxylic acid (—COOH) group, a salt of alcohol amine of Formula 1 and hydrocarbon compounds having sulfonic acid (—$SO_3H$) group, polyethylene glycol compounds of Formula 2, compounds of Formula 3, compounds having a molecular weight ranging from 1000 to 10000 including repeating unit of Formula 4 and polyether denatured silicon compounds.

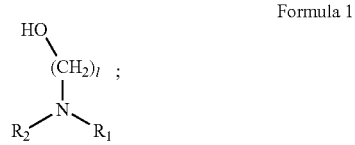

Formula 1 wherein, $R_1$ and $R_2$ are hydrogen, $C_1$-$C_{10}$ alkyl and $C_1$-$C_{10}$ alkyl alcohol; and l is an integer ranging from 1 to 10;

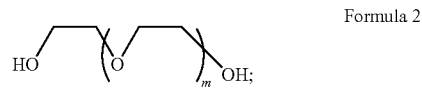

Formula 2 wherein, m is an integer ranging from 1 to 500; and number average molecular weight ranges from 62 to 20000;

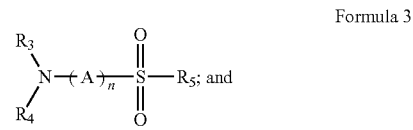

Formula 3 wherein, $R_3$ and $R_4$ are hydrogen, $C_1$-$C_{10}$ alkyl, aryl, asin, $C_1$-$C_{10}$ aminoalkyl, aminoaryl, carboxylic acid group or sulfonic acid group;

$R_5$ is amino group, hydroxyl group, $C_1$-$C_{10}$ alkyl, aryl, asin, aminoalkyl, aminoaryl, carboxylic acid group or sulfonic acid group;

A is $C_1$-$C_5$ alkylene or $C_3$-$C_{10}$ aromatic hydrocarbon; and n is an integer ranging from 0 to 2;

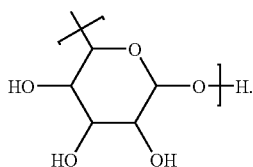

Formula 4

The cleaning solution further comprises alcohol compounds.

Here, the surfactant is present in an amount ranging from about 0.001 to about 5 wt %, preferably, ranging from 0.3 to 5 wt % of the whole cleaning solution. The alcohol compound is present in an amount ranging from 0.01 to 10 wt %, preferably, ranging from 1.7 to 10 wt % of the whole cleaning solution.

When the surfactant of below 0.001 wt % is added in the cleaning solution, the effect of reducing the surface tension is degraded. When the surfactant of over 5 wt % is added in the cleaning solution, the effect of reducing the surface tension is also degraded in spite of the added amount. Additionally, the used surfactant may remain sediments on wafers.

When the alcohol compound of below 0.01 wt % is added in the cleaning solution, the effect of reducing the surface tension is degraded. When the alcohol compound of over 10 wt % is added in the cleaning solution, the alcohol compound itself dissolves photosensitizer, thereby collapsing patterns.

The polyoxyalkylene compounds as nonionic surfactants not ionized but dissolved in water have excellent effect in emulsification, dispersion and penetration. Additionally, the polyoxyalkylene compounds have higher hydrophilicity as they have more additional portions. However, penetration, detergency, emulsifying dispersion force and foamability are changed according to kinds of hydrophobic portions used as base material.

Due to excellent chemical resistance, the polyoxyalkylene compounds are stable in acid and alkali solution, and have excellent interfacial activity in aqueous solution consisting of acid, alkali and saline, as well.

The polyoxyalkylene compounds are effective due to good compatibility with cationic, anionic and other nonionic surfactants, and excellent foamability even when a small amount of the compounds are used. Due to the above described advantages, the polyoxyalkylene compounds are commonly used as cleaning, penetrating, wetting, emulsifying dispersion, foaming and antifoaming agents in industry such as textiles, paper manufacture, agricultural medicines, medical supplies, gum, paint, resins and metalworking fields.

The polyoxyalkylene compounds are selected from the group consisting of:

1) polyoxyethylene alkylphenyl ether;
2) polyoxyethylene alkyl ether;
3) polyoxyethylene glycol fatty acid ester;
4) poly(oxypropylene-oxyethylene) block copolymer;
5) polyoxyalkylene compounds usable as antifoaming agent
6) polyoxyethylene alkylamine ether;
7) copolymer of polyoxyalkylene glycol monoalkyl ether poly(oxypropylene-oxyethylene) glycol; and
8) combinations thereof.

It is preferable that the polyoxyethylene alkylphenyl ether is selected from the group consisting of polyoxyethylene nonylphenyl ether, polyoxyethylene octylphenyl ether and combinations thereof.

It is preferable that the polyoxyethylene alkyl ether is selected from the group consisting of polyoxyethylene lauryl ether, polyoxyethylene oleyl ether, polyoxyethylene cetyl ether, polyoxyethylene cetylstearyl ether, polyoxyethylene stearyl ether, polyoxyethylene octyl ether, polyoxyethylene tridecyl ether and combinations thereof.

It is preferable that the polyoxyethylene glycol fatty acid ester is selected from the group consisting of polyoxyethylene monolaurate, polyoxyethylene monoolerate, polyoxyethylene monostearate, polyoxyethylene lanolin, polyoxyethylene castor oil and combinations thereof.

It is preferable that the polyoxyalkylene compounds usable as antifoaming agent is selected from the group consisting of polyoxyethylene glycol copolymer, poly(oxyethylene-oxypropylene) glycol copolymer, poly alkyl ether, polyoxyalkylene triol and combinations thereof.

It is preferable that the polyoxyethylene alkylamine ether is selected from the group consisting of polyoxyethylene laurylamine ether, polyoxyethylene stearylamine ether and combinations thereof.

The salt of alcohol amine of Formula 1 and hydrocarbon compounds having carboxylic acid group such as fatty acid and the salt of alcohol amine of Formula 1 and hydrocarbon compounds having sulfonic acid group has excellent interfacial activity, low pH in comparison with insoluble metal soap formed of metal salt except alkali metal salt and detergency and stability in neutrality, thereby used as detergent or emulsifier due to high solubility in water and organic solvent.

The alcohol amine of Formula 1, ethanol amine, is selected from the group consisting of monoethanol amine, diethanol amine and triethanol amine.

The hydrocarbon compounds having carboxylic acid group are compounds of $C_2$-$C_{500}$. It is preferable that the hydrocarbon compound having carboxylic acid group is selected from the group consisting of acetic acid, tetracosanoic acid, linoleic acid, oleic acid, stearic acid and combinations thereof.

The hydrocarbon compounds having sulfonic acid group are compounds of $C_2$-$C_{500}$. It is preferable that the hydrocarbon compound having sulfonic acid group is selected from the group consisting of lignosulfonic acid, methanesulfonic acid, p-toluenesulfonic acid and combinations thereof.

The polyethylene glycol compounds of Formula 2 includes an lipophilic group such as the alkylene group having a long chain form and a hydrophilic group such as the hydroxy group in molecules, thereby deteriorating surface tension. The polyethylene glycol does not harm to lips or skin because it has little toxicity and irritation. Accordingly, the polyethylene glycol compounds are suitable for surfactant.

Additionally, the polyethylene glycol compounds are transformed from liquid into solid state such as paste or wax type as average molecular weight increases. If average molecular weight more increases, the polyethylene glycol compounds are transformed into white flake phase, which are soluble in water regardless of liquid or solid states. A polyethylene glycol having a random form can be fabricated when mixed with a proper ratio.

Accordingly, the polyethylene glycol compounds may be used solely or by mixture because these compounds are soluble in water regardless of liquid having low molecular weight or solid states having high molecular weight and mixed each other.

The sulfa-imide compound of Formula 3 having solubility higher than carboxylic acid group to water as solvent, is preferably selected from the group consisting of sulfamide, sulfadiazine, sulfanilamide, sulfamic acid, sulfanilic acid and sulfasalazine. Here, the compounds except sulfanilic acid are sulfa amide compounds of Formula 1 wherein n is 0.

The compound having a molecular weight ranging from 1000 to 10000 including repeating unit of Formula 4 is selected from the group consisting of glucose, glucuronamide, glucuronic acid, sucrose, lactose, lactitol and combinations thereof.

The compound including repeating unit of Formula 4 is soluble in water, and remarkably lowers the surface tension of aqueous solution. The compound does not harm to lips or skin because it has little toxicity and irritation. As a result, the compound is used as additive for lowering surface tension.

Preferably, the polyether denatured silicon compound has a molecular weight ranging from 1000 to 10000. It is preferable that the polyether denatured silicon compounds comprise the repeating unit of Formula 5.

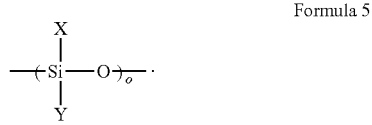

Formula 5 wherein

X is $CH_3$, $C_2$-$C_{500}$ polyether, alcohol or ammonium salt;

Y is H, $CH_3$, $C_2$-$C_{500}$ polyether, alcohol or ammonium salt; and o is an integer ranging from 1 to 200.

As an example, the polyether denatured silicon compounds are represented by Formula 5a:

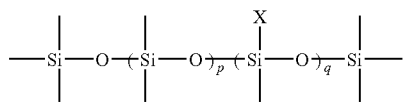

Formula 5a wherein,

X is $C_2$-$C_{500}$ polyether, alcohol or ammonium salt; and p and q individually are an integer ranging from 1 to 100.

Here, it is preferable that the X is selected from the group consisting of polyether of Formula 6, alcohol of Formula 7 and ammonium salt of Formulas 8a and 8b:

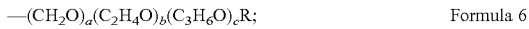  Formula 6

  Formula 7

  Formula 8a

  Formula 8b wherein,

R, R' and R" individually are hydrogen or $C_1$-$C_{100}$ alkyl; B is $CH_2COO$ or halogen;

a, b and c individually are an integer ranging from 1 to 100; and d is an integer ranging from 1 to 10;

A typical example of Formula 8a is $—(CH_2)_3N^+(CH_3)_2CH_2COO^-$ and a typical example of Formula 8b is $—N^+(CH_3)_3Cl^-$.

The polyether denatured silicon compounds having low molecular weight may remarkably lower surface tension of aqueous solution and have a low solidifying point. However, because the surface tension of aqueous solution is influenced by pH, activity may be lowered when beyond the optimum pH lowering surface tension.

The alcohol compound is selected from the group consisting of $C_1$-$C_{10}$ alkyl alcohol, $C_1$-$C_{10}$ alkoxyalcohol and combinations thereof. It is preferable that the $C_1$-$C_{10}$ alkyl alcohol is selected from the group consisting of methanol, ethanol, propanol, isopropanol, n-butanol, sec-butanol, t-butanol, 1-pentanol, 2-pentanol, 3-pentanol, 2,2-dimethyl-1-propanol and combinations thereof.

It is preferable that the $C_1$-$C_{10}$ alkoxyalcohol is selected from the group consisting of 2-methoxyethanol, 2-(2-methoxyethoxy)ethanol, 1-methoxy-2-propanol, 3-methoxy-1,2-propanediol and combinations thereof.

It is preferable that distilled water is used as water of the cleaning solution.

The cleaning solution of the present invention is fabricated by filtering the mixed solutions of alcohol compound, water and surfactant through 0.2 μm filter.

A method of forming photoresist patterns using an etching and developing process comprises:

(a) forming a photoresist film by coating photoresist on a top portion of an underlying layer formed on a semiconductor substrate;

(b) exposing the photoresist film;

(c) developing the exposed photoresist film using a developer; and (d) cleaning the resultant structure using the cleaning solution of the present invention.

The method further comprises performing a soft-bake process before part (b) step and a post-bake process after part (b). Here, it is preferable that the bake processes are performed at a temperature ranging from 70 to 200° C.

The exposing process (b) is preferable performed using an exposure source of part (b) selected from the group consisting of KrF(248 nm), ArF(193 nm), VUV (157 nm), EUV(13 nm), E-beam, X-ray and ion-beam, with exposing energy ranging from 0.1 to 50 mJ/cm².

The developing process (c) is performed using alkali developer which is teteramethylammoniumhydroxide (TMAH) aqueous solution ranging from 0.01 to 5 wt %.

The cleaning solution has a lowered surface tension through the cleaning process (d), thereby preventing erosion of patterns during the developing process.

A semiconductor device manufactured using the method according to the present invention is also disclosed.

The disclosed cleaning solution will be described in more details by referring to examples below, which are not intended to be limiting.

Preparation of Cleaning Solution

EXAMPLE 1

Preparation of Cleaning Solution (1)

Polyoxyethylene nonylphenyl ether (1 g), isopropanol (4 g) and water (95 g) were stirred for 1 minute. The resulting mixture was filtered through 0.2 µm filter to obtain cleaning solution of the present invention.

EXAMPLE 2

Preparation of Cleaning Solution (2)

Polyoxyethylene lauryl ether (1 g), isopropanol (4 g) and water (95 g) were stirred for 1 minute. The resulting mixture was filtered through 0.2 µm filter to obtain cleaning solution of the present invention.

EXAMPLE 3

Preparation of Cleaning Solution (3)

Polyoxyethylene monolaurate (1 g), isopropanol (4 g) and water (95 g) were stirred for 1 minute. The resulting mixture was filtered through 0.2 µm filter to obtain cleaning solution of the present invention.

EXAMPLE 4

Preparation of Cleaning Solution (4)

Polyoxyethylene triol (1 g), isopropanol (4 g) and water (95 g) were stirred for 1 minute. The resulting mixture was filtered through 0.21 µm filter to obtain cleaning solution of the present invention.

EXAMPLE 5

Preparation of Cleaning Solution (5)

Polyoxyethylene triol (1 g), methanol (4 g) and water (95 g) were stirred for 1 minute. The resulting mixture was filtered through 0.2 µm filter to obtain cleaning solution of the present invention.

EXAMPLE 6

Preparation of Cleaning Solution (6)

Monoethanol amine-tetracosanoic acid (1:1 mol %) salt (1 g), isopropanol (4 g) and water (95 g) were stirred for 1 minute. The resulting mixture was filtered through 0.2 µm filter to obtain cleaning solution of the present invention.

EXAMPLE 7

Preparation of Cleaning Solution (7)

Triethanol amine-linoleic acid (1:1 mol %) salt (1 g), ethanol (4 g) and water (95 g) were stirred for 1 minute. The resulting mixture was filtered through 0.2 µm filter to obtain cleaning solution of the present invention.

EXAMPLE 8

Preparation of Cleaning Solution (8)

Triethanol amine-acetic acid (1:1 mol %) salt (1 g), isopropanol (4 g) and water (95 g) were stirred for 1 minute. The resulting mixture was filtered through 0.2 µm filter to obtain cleaning solution of the present invention.

EXAMPLE 9

Preparation of Cleaning Solution (9)

Diethanol amine-stearic acid (1:1 mol %) salt (1 g), 1-pentanol (4 g) and water (95 g) were stirred for 1 minute. The resulting mixture was filtered through 0.2 µm filter to obtain cleaning solution of the present invention.

EXAMPLE 10

Preparation of Cleaning Solution (10)

Triethanol amine-oleic acid (1:1 mol %) salt (1 g), methanol (4 g) and water (95 g) were stirred for 1 minute. The resulting mixture was filtered through 0.2 µm filter to obtain cleaning solution of the present invention.

EXAMPLE 11

Preparation of Cleaning Solution (11)

Monoethanol amine-lignosulfonic acid (1:1 mol %) salt (1 g), isopropanol (4 g) and water (95 g) were stirred for 1 minute. The resulting mixture was filtered through 0.2 µm filter to obtain cleaning solution of the present invention.

EXAMPLE 12

Preparation of Cleaning Solution (12)

Triethanol amine-methanesulfonic acid (1:1 mol %) salt (1 g), ethanol (4 g) and water (95 g) were stirred for 1 minute. The resulting mixture was filtered through 0.2 µm filter to obtain cleaning solution of the present invention.

EXAMPLE 13

Preparation of Cleaning Solution (13)

Triethanol amine-p-toluenesulfonic acid (1:1 mol %) salt (1 g), isopropanol (4 g) and water (95 g) were stirred for 1 minute. The resulting mixture was filtered through 0.2 µm filter to obtain cleaning solution of the present invention.

EXAMPLE 14

Preparation of Cleaning Solution (14)

Diethanol amine-lignosulfonic acid (1:1 mol %) salt (1 g), 1-pentanol (4 g) and water (95 g) were stirred for 1 minute. The resulting mixture was filtered through 0.2 µm filter to obtain cleaning solution of the present invention.

EXAMPLE 15

Preparation of Cleaning Solution (15)

Triethanol amine-lignosulfonic acid (1:1 mol %) salt (1 g), methanol (4 g) and water (95 g) were stirred for 1 minute. The resulting mixture was filtered through 0.2 µm filter to obtain cleaning solution of the present invention.

EXAMPLE 16

Preparation of Cleaning Solution (16)

The compound of Formula 2 having number average molecular weight of 200 (0.5 g), isopropanol (4 g) and water (95 g) were stirred for 1 minute. The resulting mixture was filtered through 0.2 µm filter to obtain cleaning solution of the present invention.

EXAMPLE 17

Preparation of Cleaning Solution (17)

The compound of Formula 2 having number average molecular weight of 1000 (0.5 g), ethanol (4 g) and water (95 g) were stirred for 1 minute. The resulting mixture was filtered through 0.2 µm filter to obtain cleaning solution of the present invention.

EXAMPLE 18

Preparation of Cleaning Solution (18)

Tetraethylene glycol (0.5 g), isopropanol (4 g) and water (95 g) were stirred for 1 minute. The resulting mixture was filtered through 0.2 µm filter to obtain cleaning solution of the present invention.

EXAMPLE 19

Preparation of Cleaning Solution (19)

The compound of Formula 2 having number average molecular weight of 1450 (0.5 g), 1-pentanol (4 g) and water (95 g) were stirred for 1 minute. The resulting mixture was filtered through 0.2 µm filter to obtain cleaning solution of the present invention.

EXAMPLE 20

Preparation of Cleaning Solution (20)

Sulfasalazine (0.5 g), isopropanol (4 g) and water (95 g) were stirred for 1 minute. The resulting mixture was filtered through 0.2 µm filter to obtain cleaning solution of the present invention.

EXAMPLE 21

Preparation of Cleaning Solution (21)

Sulfanilic acid (0.5 g), ethanol (4 g) and water (95 g) were stirred for 1 minute. The resulting mixture was filtered through 0.2 µm filter to obtain cleaning solution of the present invention.

EXAMPLE 22

Preparation of Cleaning Solution (22)

Sulfamic acid (0.5 g), isopropanol (4 g) and water (95 g) were stirred for 1 minute. The resulting mixture was filtered through 0.2 µm filter to obtain cleaning solution of the present invention.

EXAMPLE 23

Preparation of Cleaning Solution (23)

Sulfanilamide (0.5 g), 1-pentanol (4 g) and water (95 g) were stirred for 1 minute. The resulting mixture was filtered through 0.2 µm filter to obtain cleaning solution of the present invention.

EXAMPLE 24

Preparation of Cleaning Solution (24)

Glucose (0.5 g), isopropanol (4 g) and water (95 g) were stirred for 1 minute. The resulting mixture was filtered through 0.2 µm filter to obtain cleaning solution of the present invention.

EXAMPLE 25

Preparation of Cleaning Solution (25)

Glucuronic acid (0.5 g), ethanol (4 g) and water (95 g) were stirred for 1 minute. The resulting mixture was filtered through 0.2 µm filter to obtain cleaning solution of the present invention.

EXAMPLE 26

Preparation of Cleaning Solution (26)

Lactose (0.5 g), isopropanol (4 g) and water (95 g) were stirred for 1 minute. The resulting mixture was filtered through 0.2 µm filter to obtain cleaning solution of the present invention.

EXAMPLE 27

Preparation of Cleaning Solution (27)

Lactitol (0.5 g), 1-pentanol (4 g) and water (95 g) were stirred for 1 minute. The resulting mixture was filtered through 0.2 µm filter to obtain cleaning solution of the present invention.

EXAMPLE 28

Preparation of Cleaning Solution (28)

The compound of Formula 5a wherein X is $CH_2CH_2OCH_2CH_2OCH_3$ (1 g), isopropanol (4 g) and water (95 g) were stirred for 1 minute. The resulting mixture was filtered through 0.2 µm filter to obtain cleaning solution of the present invention.

EXAMPLE 29

Preparation of Cleaning Solution (29)

The compound of Formula 5a wherein X is $CH_2CH_2OH$ (1 g), ethanol (4 g) and water (95 g) were stirred for 1 minute. The resulting mixture was filtered through 0.2 µm filter to obtain cleaning solution of the present invention.

EXAMPLE 30

Preparation of Cleaning Solution (30)

The compound of Formula 5a wherein X is $(CH_2)_3N^+(CH_3)_2CH_2COO^-$ (1 g), isopropanol (4 g) and water (95 g)

were stirred for 1 minute. The resulting mixture was filtered through 0.2 μm filter to obtain cleaning solution of the present invention.

EXAMPLE 31

Preparation of Cleaning Solution (31)

The compound of Formula 5a wherein X is $(CH_2)_3N^+$ $(CH_3)_2CH_2COO^-$(1 g), 1-pentanol (4 g) and water (95 g) were stirred for 1 minute. The resulting mixture was filtered through 0.2 μm filter to obtain cleaning solution of the present invention.

Formation of Patterns Using the Cleaning Solution

EXAMPLE 32

Formation of Photoresist Patterns (1)

After an underlying layer was formed on a silicon wafer treated with hexamethyldisilazane (HMDS), a photoresist having methacrylate type, AX1020P produced by Clariant Co., was spin-coated on silicon wafer at 3000 rpm to form a photoresist film, and soft-backed at about 120° C. for about 90 seconds. After soft-baking, the photoresist was exposed to light using an ArF laser exposer, and then post-baked at about 120° C. for about 90 seconds. When the post-baking was completed, it was developed in 2.38 wt % aqueous teteramethylammoniumhydroxide solution for 30 seconds. While the silicon wafer was spun, the silicon wafer was cleaned by spraying the cleaning solution of 30 ml prepared in Example 1 from the spin device and then dried, to obtain 83 nm Line pattern (see FIG. 1).

EXAMPLE 33

Formation of Photoresist Patterns (2)

Figure 2:
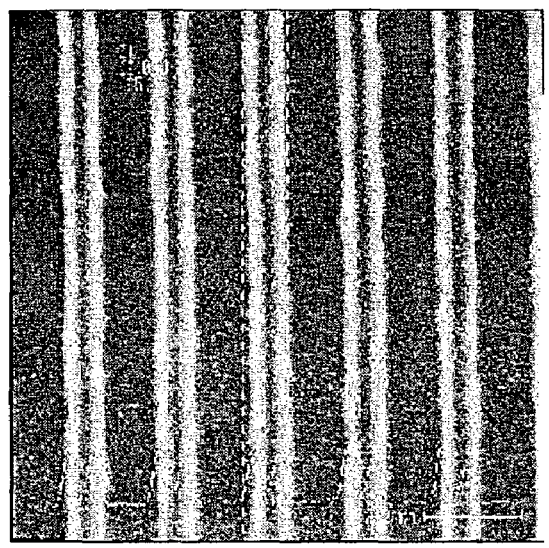

The procedure of Example 32 was repeated using the cleaning solution of Example 2 instead of the cleaning solution of Example 1 to obtain the pattern of 90 nm Line pattern (see FIG. 2).

EXAMPLE 34

Formation of Photoresist Patterns (3)

Figure 3:
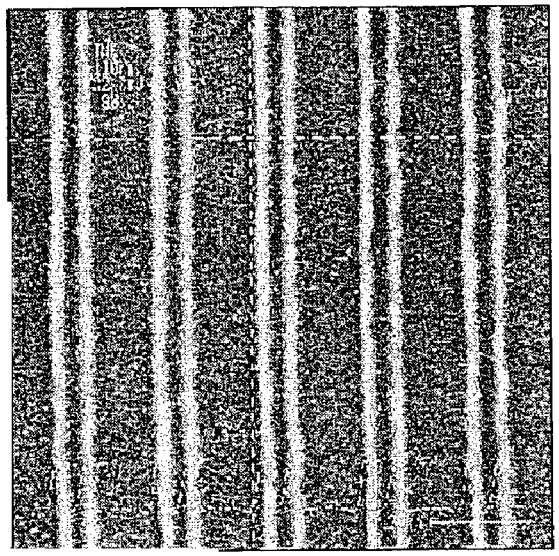

The procedure of Example 32 was repeated using the cleaning solution of Example 3 instead of the cleaning solution of example 1 to obtain the pattern of 93 nm Line pattern (see FIG. 3).

EXAMPLE 35

Formation of Photoresist Patterns (4)

Figure 4:
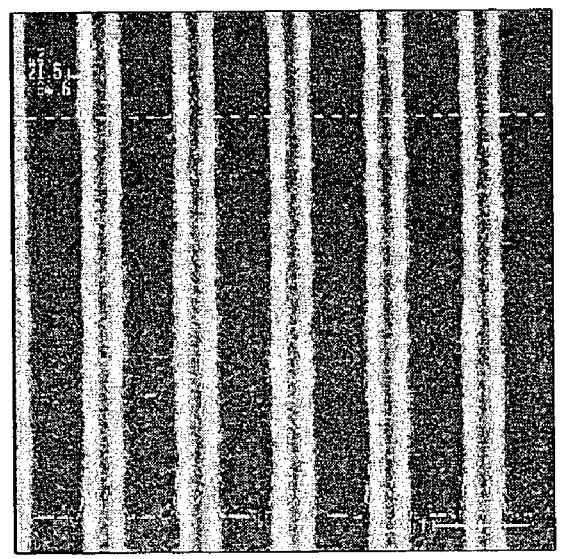

The procedure of Example 32 was repeated using the cleaning solution of Example 4 instead of the cleaning solution of example 1 to obtain the pattern of 92 nm Line pattern (see FIG. 4).

EXAMPLE 36

Formation of Photoresist Patterns (5)

Figure 5:
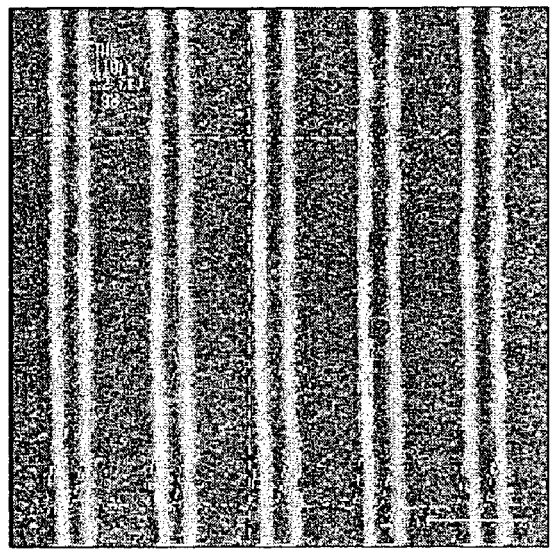

The procedure of Example 32 was repeated using the cleaning solution of Example 5 instead of the cleaning solution of example 1 to obtain the pattern of 87 nm Line pattern (see FIG. 5).

EXAMPLE 37

Formation of Photoresist Patterns (6)

Figure 6:
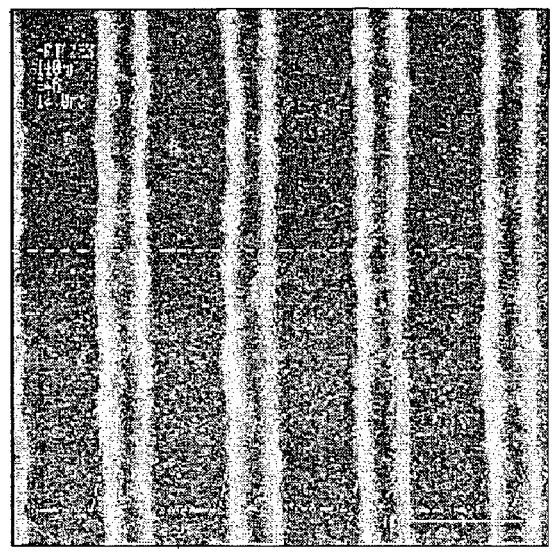

The procedure of Example 32 was repeated using the cleaning solution of Example 6 instead of the cleaning solution of example 1 to obtain the pattern of 83 nm Line pattern (see FIG. 6).

EXAMPLE 38

Formation of Photoresist Patterns (7)

Figure 7:
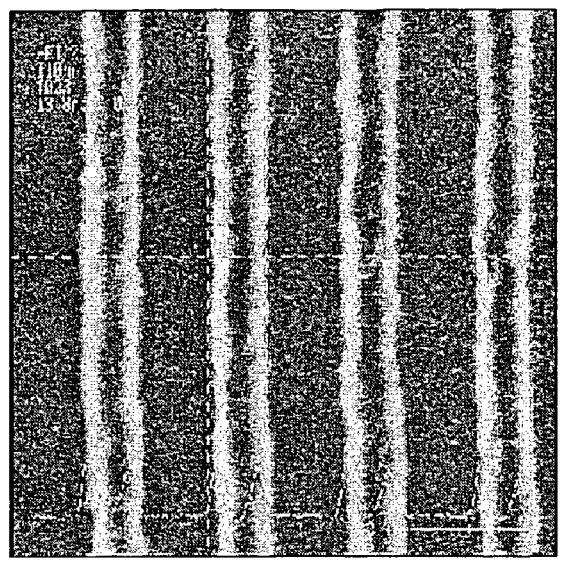

The procedure of Example 32 was repeated using the cleaning solution of Example 7 instead of the cleaning solution of example 1 to obtain the pattern of 90 nm Line pattern (see FIG. 7).

EXAMPLE 39

Formation of Photoresist Patterns (8)

Figure 8:
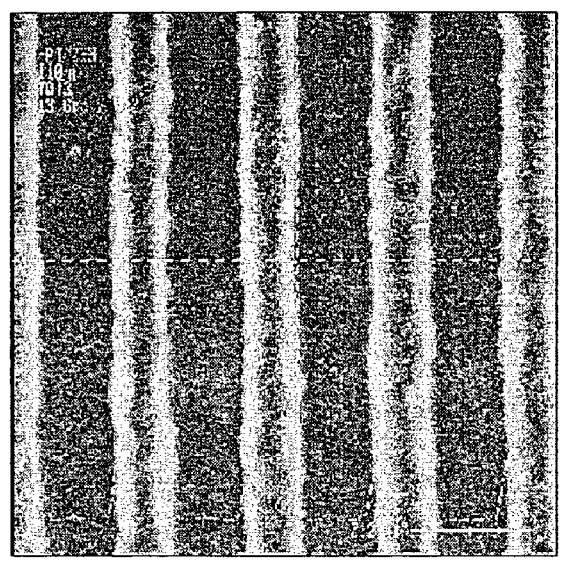

The procedure of Example 32 was repeated using the cleaning solution of Example 8 instead of the cleaning solution of example 1 to obtain the pattern of 87 nm Line pattern (see FIG. 8).

EXAMPLE 40

Formation of Photoresist Patterns (9)

Figure 9:
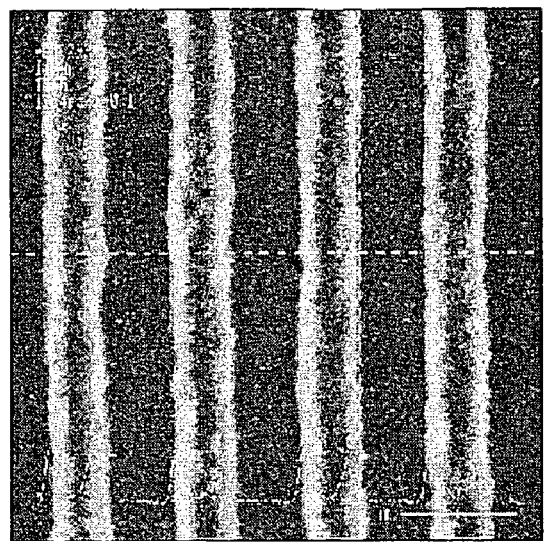

The procedure of Example 32 was repeated using the cleaning solution of Example 9 instead of the cleaning solution of example 1 to obtain the pattern of 92 nm Line pattern (see FIG. 9).

EXAMPLE 41

Formation of Photoresist Patterns (10)

Figure 10:
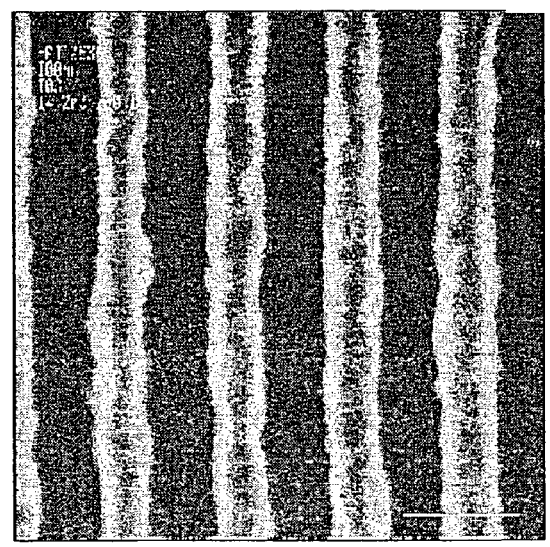

The procedure of Example 32 was repeated using the cleaning solution of Example 10 instead of the cleaning solution of example 1 to obtain the pattern of 87 nm Line pattern (see FIG. 10).

EXAMPLE 42

Formation of Photoresist Patterns (11)

Figure 11:
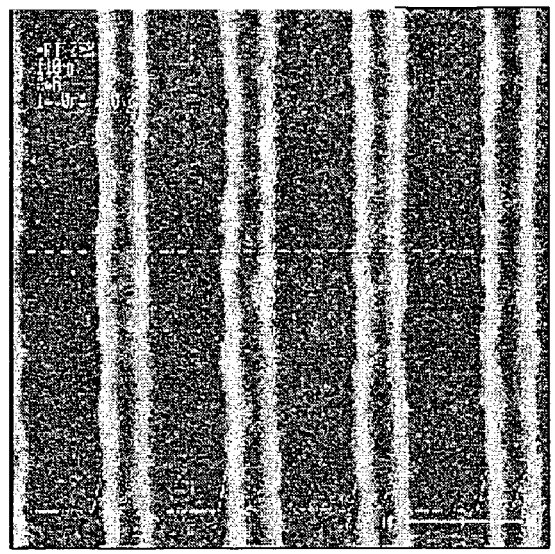

The procedure of Example 32 was repeated using the cleaning solution of Example 11 instead of the cleaning solution of example 1 to obtain the pattern of 100 nm Line pattern (see FIG. 11).

EXAMPLE 43

Formation of Photoresist Patterns (12)

Figure 12:
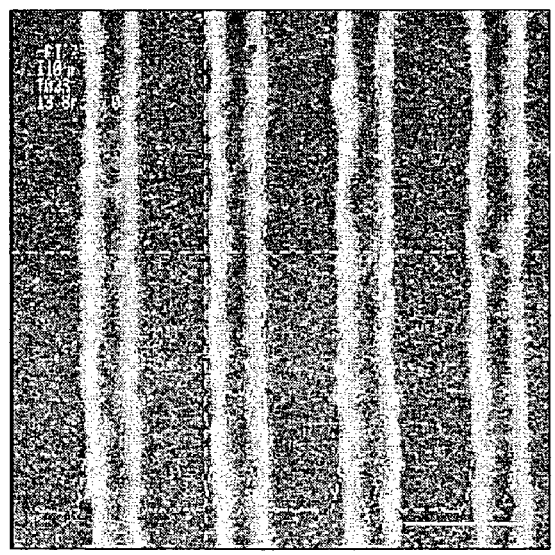

The procedure of Example 32 was repeated using the cleaning solution of Example 12 instead of the cleaning solution of example 1 to obtain the pattern of 98 nm Line pattern (see FIG. 12).

EXAMPLE 44

Formation of Photoresist Patterns (13)

Figure 13:
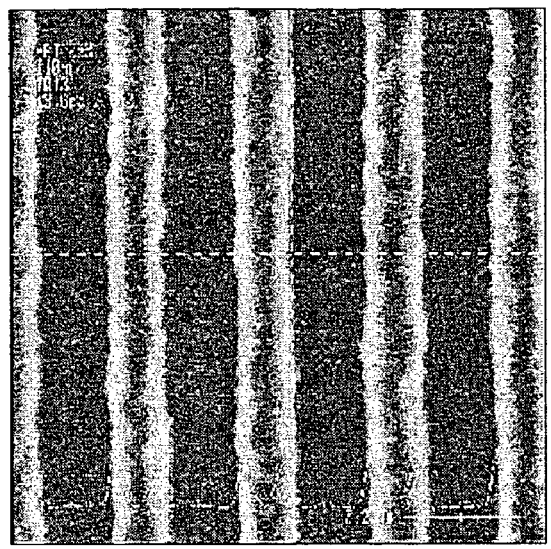

The procedure of Example 32 was repeated using the cleaning solution of Example 13 instead of the cleaning solution of example 1 to obtain the pattern of 105 nm Line pattern (see FIG. 13).

EXAMPLE 45

Formation of Photoresist Patterns (14)

Figure 14:
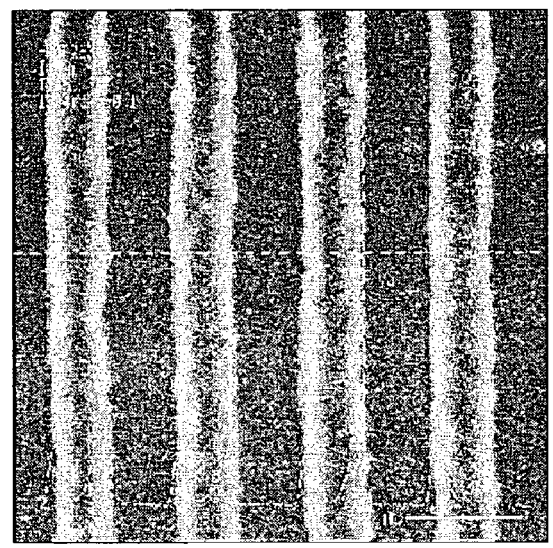

The procedure of Example 32 was repeated using the cleaning solution of Example 14 instead of the cleaning solution of example 1 to obtain the pattern of 100 nm Line pattern (see FIG. 14).

EXAMPLE 46

Formation of Photoresist Patterns (15)

Figure 15:
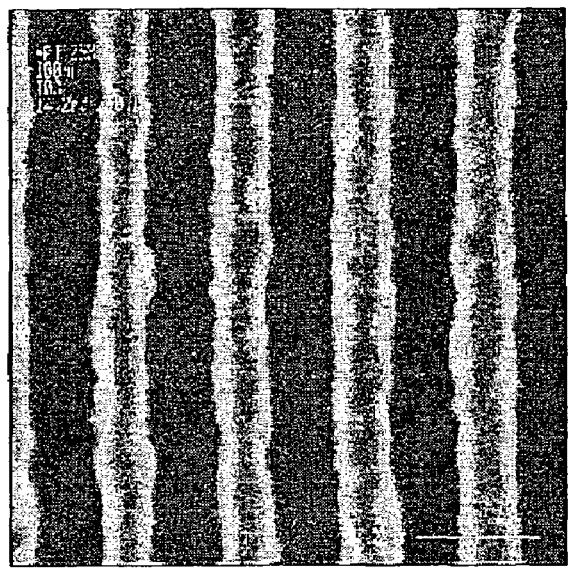

The procedure of Example 32 was repeated using the cleaning solution of Example 15 instead of the cleaning solution of example 1 to obtain the pattern of 99 nm Line pattern (see FIG. 15).

EXAMPLE 47

Formation of Photoresist Patterns (16)

Figure 16:
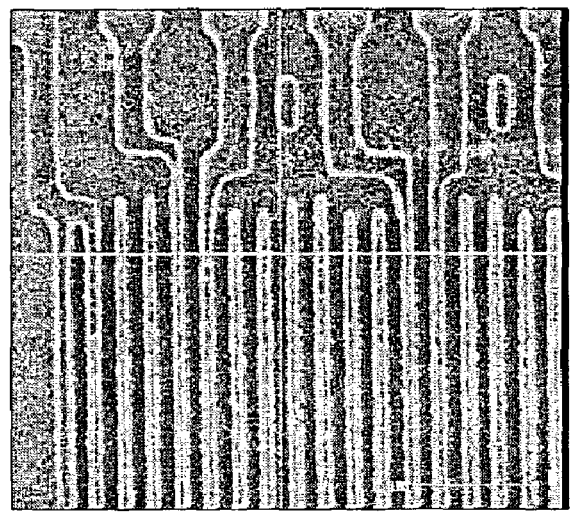
FIGS. 16 and 17 are photographs of photoresist patterns obtained from Example 47.
Figure 17:
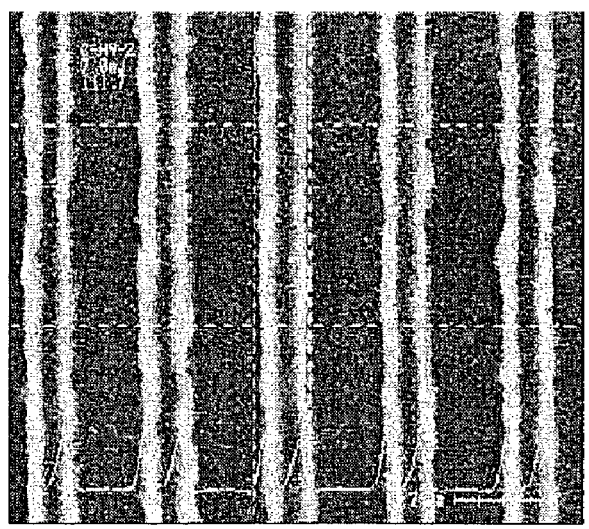

The procedure of Example 32 was repeated using the cleaning solution of Example 16 instead of the cleaning solution of example 1 to obtain the pattern of 100 nm Line pattern (see FIGS. 16 and 17).

EXAMPLE 48

Formation of Photoresist Patterns (17)

Figure 18:
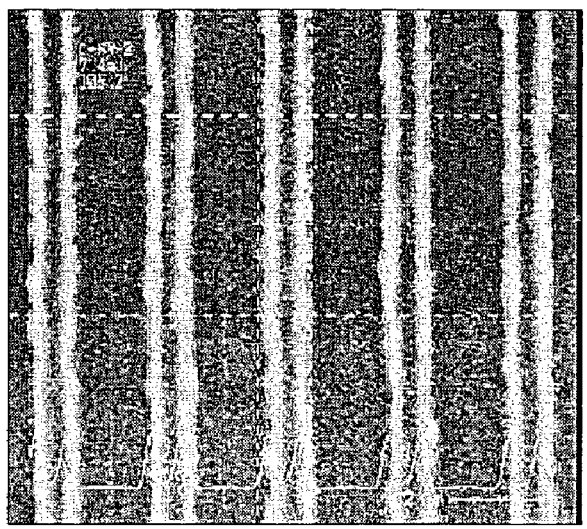
FIGS. 18 through 24 are photographs of photoresist patterns obtained from Examples 48 through 54.

The procedure of Example 32 was repeated using the cleaning solution of Example 17 instead of the cleaning solution of example 1 to obtain the pattern of 100 nm Line pattern (see FIG. 18).

EXAMPLE 49

Formation of Photoresist Patterns (18)

Figure 19:
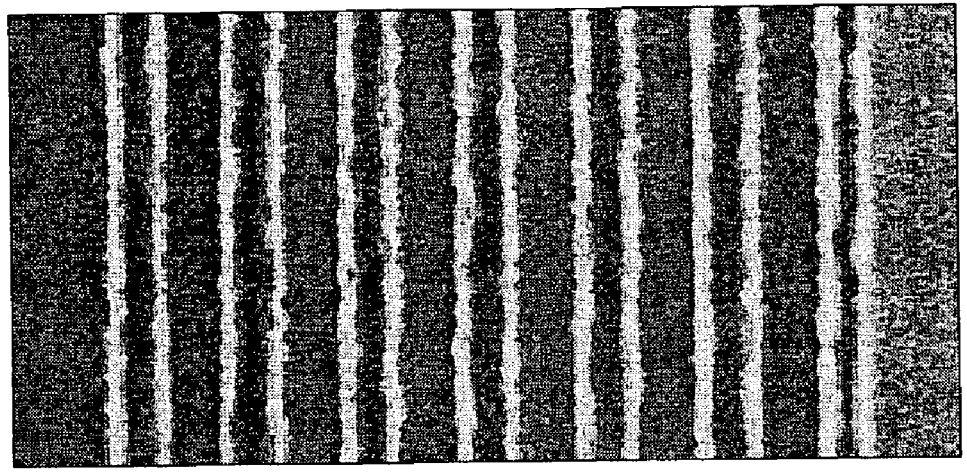

The procedure of Example 32 was repeated using the cleaning solution of Example 18 instead of the cleaning solution of example 1 to obtain the pattern of 100 nm Line pattern (see FIG. 19).

EXAMPLE 50

Formation of Photoresist Patterns (19)

Figure 20:
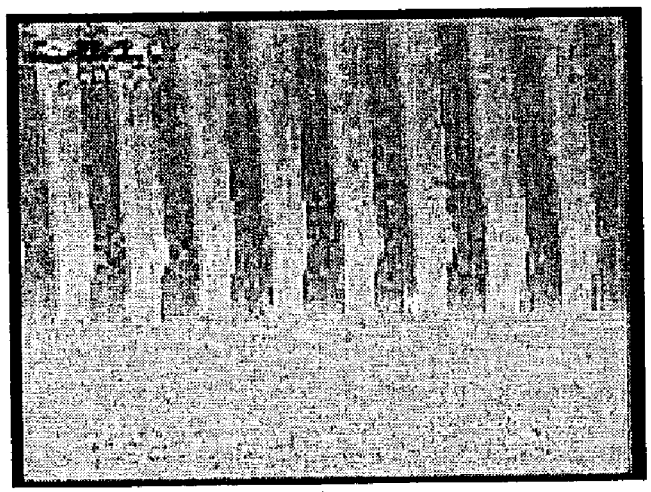

The procedure of Example 32 was repeated using the cleaning solution of Example 19 instead of the cleaning solution of example 1 to obtain the pattern of 100 nm Line pattern (see FIG. 20).

EXAMPLE 51

Formation of Photoresist Patterns (20)

Figure 21:
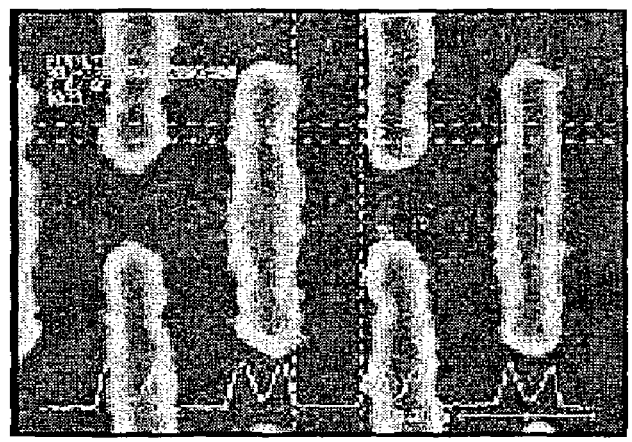

The procedure of Example 32 was repeated using the cleaning solution of Example 20 instead of the cleaning solution of example 1 to obtain the pattern of 100 nm Line pattern (see FIG. 21).

EXAMPLE 52

Formation of Photoresist Patterns (21)

Figure 22:
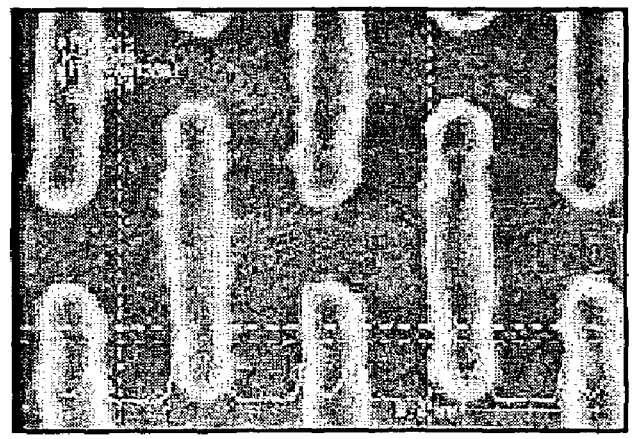

The procedure of Example 32 was repeated using the cleaning solution of Example 21 instead of the cleaning solution of example 1 to obtain the pattern of 100 nm Line pattern (see FIG. 22).

EXAMPLE 53

Formation of Photoresist Patterns (22)

Figure 23:
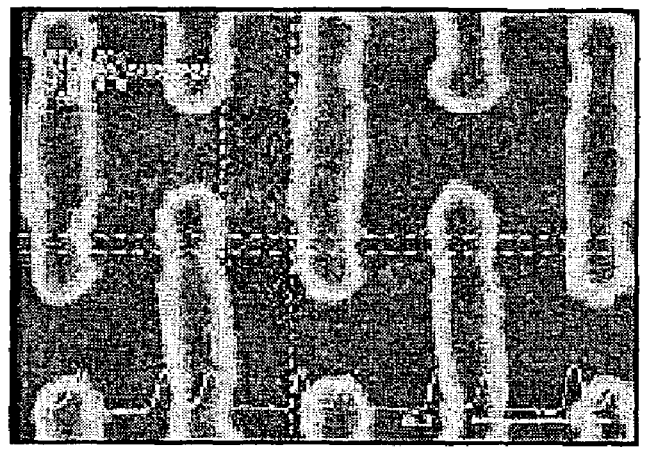

The procedure of Example 32 was repeated using the cleaning solution of Example 22 instead of the cleaning solution of example 1 to obtain the pattern of 100 nm Line pattern (see FIG. 23).

EXAMPLE 54

Formation of Photoresist Patterns (23)

Figure 24:
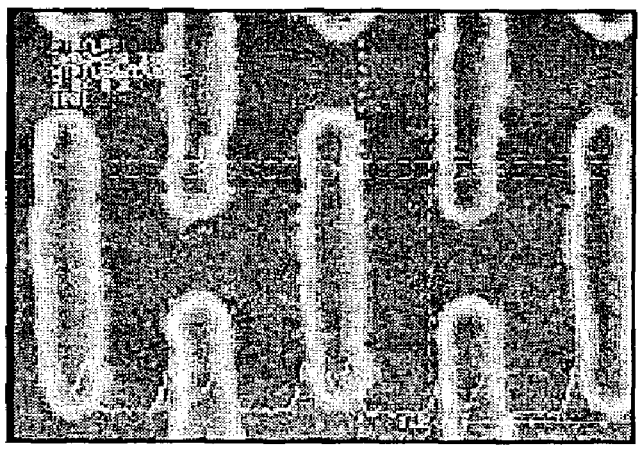

The procedure of Example 32 was repeated using the cleaning solution of Example 23 instead of the cleaning solution of example 1 to obtain the pattern of 100 nm Line pattern (see FIG. 24).

EXAMPLE 55

Formation of Photoresist Patterns (24)

Figure 25:
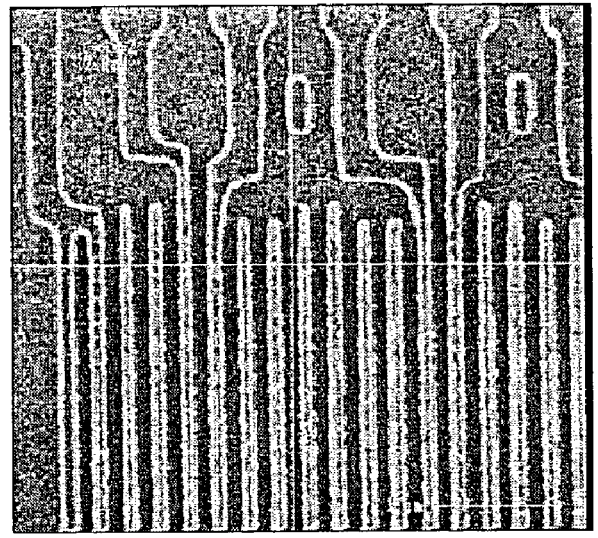
FIGS. 25 and 26 are photographs of photoresist patterns obtained from Example 55.
Figure 26:
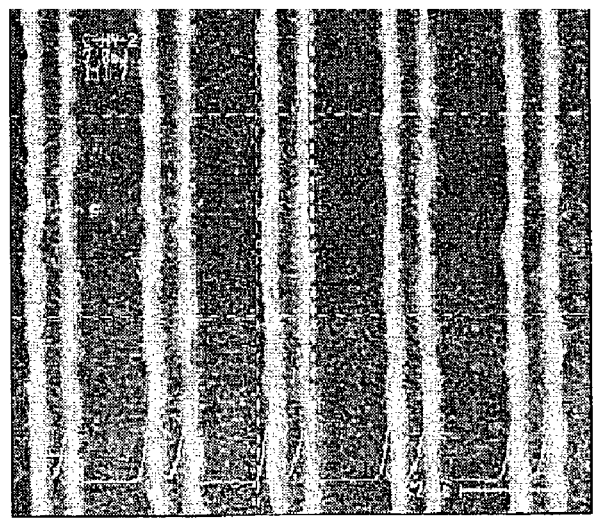

The procedure of Example 32 was repeated using the cleaning solution of Example 24 instead of the cleaning solution of example 1 to obtain the pattern of 100 nm Line pattern (see FIGS. 25 and 26).

EXAMPLE 56

Formation of Photoresist Patterns (25)

Figure 27:
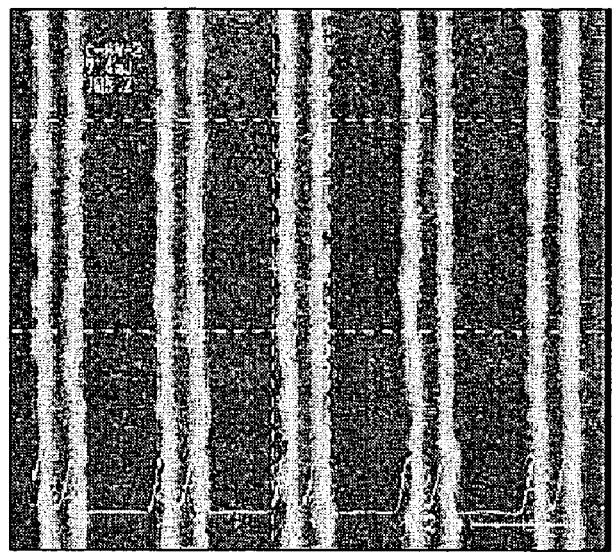
FIGS. 27 through 33 are photographs of photoresist patterns obtained from Examples 56 through 62.

The procedure of Example 32 was repeated using the cleaning solution of Example 25 instead of the cleaning solution of example 1 to obtain the pattern of 100 nm Line pattern (see FIG. 27).

EXAMPLE 57

Formation of Photoresist Patterns (26)

Figure 28:
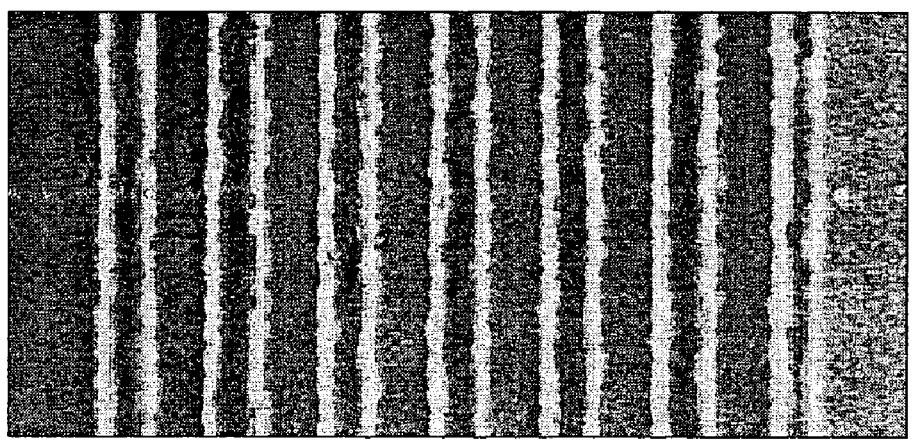

The procedure of Example 32 was repeated using the cleaning solution of Example 26 instead of the cleaning solution of example 1 to obtain the pattern of 100 nm Line pattern (see FIG. 28).

EXAMPLE 58

Formation of Photoresist Patterns (27)

Figure 29:
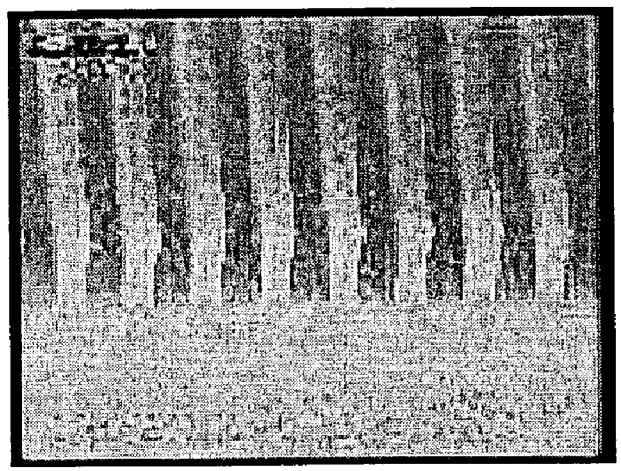

The procedure of Example 32 was repeated using the cleaning solution of Example 27 instead of the cleaning solution of example 1 to obtain the pattern of 100 nm Line pattern (see FIG. 29).

EXAMPLE 59

Formation of Photoresist Patterns (28)

Figure 30:
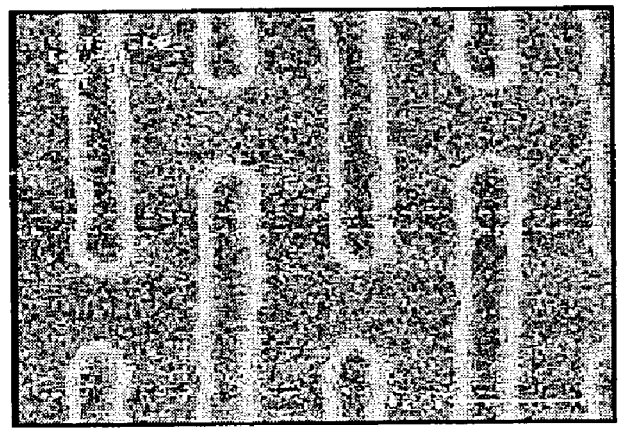

The procedure of Example 32 was repeated using the cleaning solution of Example 28 instead of the cleaning solution of example 1 to obtain the pattern of 100 nm Line pattern (see FIG. 30).

EXAMPLE 60

Formation of Photoresist Patterns (29)

Figure 31:
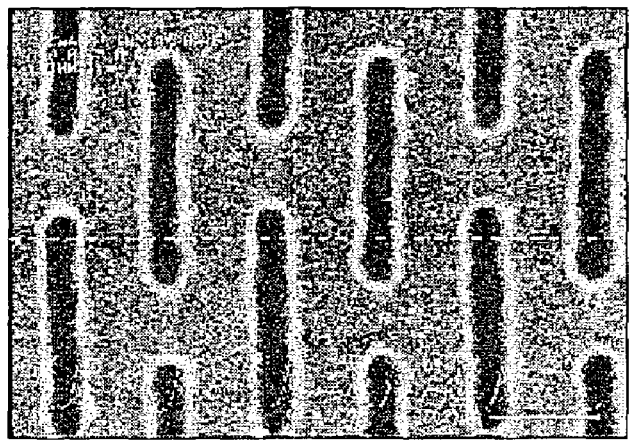

The procedure of Example 32 was repeated using the cleaning solution of Example 29 instead of the cleaning solution of example 1 to obtain the pattern of 100 nm Line pattern (see FIG. 31).

EXAMPLE 61

Formation of Photoresist Patterns (30)

Figure 32:
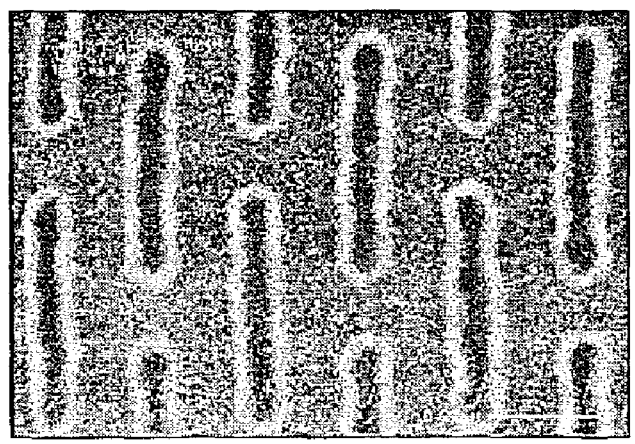

The procedure of Example 32 was repeated using the cleaning solution of Example 30 instead of the cleaning solution of example 1 to obtain the pattern of 100 nm Line pattern (see FIG. 32).

EXAMPLE 62

Formation of Photoresist Patterns (31)

Figure 33:
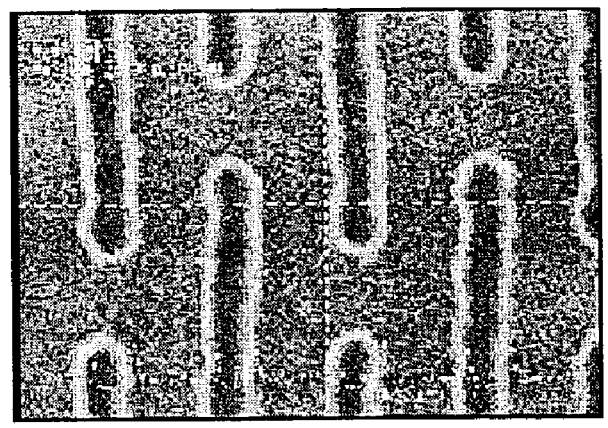

The procedure of Example 32 was repeated using the cleaning solution of Example 31 instead of the cleaning solution of example 1 to obtain the pattern of 100 nm Line pattern (see FIG. 33).

COMPARATIVE EXAMPLE 1

Formation of Photoresist Patterns

Figure 34:
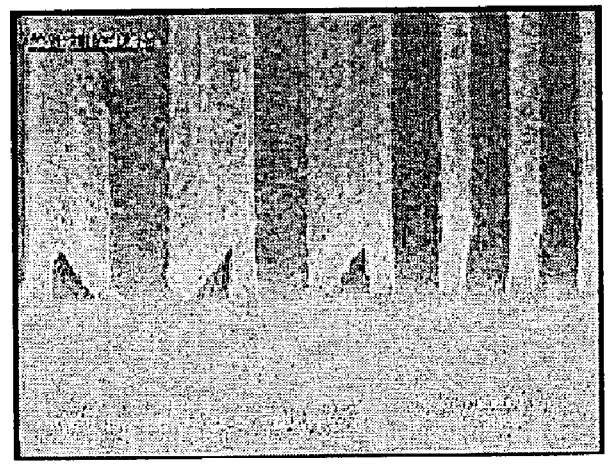
FIG. 34 is photographs of photoresist patterns obtained from Comparative Example 1.

The procedure of Example 32 was repeated using distilled water instead of cleaning solution according to the present invention to obtain photoresist patterns. The photoresist patterns are eroded (see FIG. 34).

As discussed earlier, the cleaning solution for removing photoresist material according to this disclosure can prevent the erosion of patterns when semiconductor substrates are cleaned to obtain photoresist patterns because the cleaning solution has the lower surface tension than that of distilled water. Accordingly, the cleaning solution of the present invention may stabilize the process of forming hyperfine photoresist patterns of below 130 nm.

What is claimed:

1. A cleaning solution for photoresist pattern consisting essentially of:
   (i) water ($H_2O$) as main component;
   (ii) 0.001 to 5 wt % of compounds of Formula 3 as an additive; and
   (iii) at least one alcohol compound present in a range of 0.01 wt % to 10 wt %;

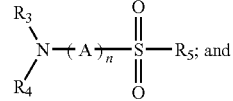

Formula 3 wherein $R_3$ and $R_4$ are selected from the group consisting of hydrogen, $C_1$-$C_{10}$ alkyl, aryl, asin, $C_1$-$C_{10}$ aminoalkyl, aminoaryl and pyridinyl; $R_5$ is amino group, $C_1$-$C_{10}$ alkyl, aryl, asin, aminoalkyl, aminoaryl, or 5-(phenylazo)salicylic acid group; A is $C_1$-$C_5$ alkylene or $C_3$-$C_{10}$ aromatic hydrocarbon; and n is an integer ranging from 0 to 2.

2. The cleaning solution according to claim 1, wherein the additive is present in an amount ranging from 0.3 to 5 wt % and the at least one alcohol compound is present in an amount ranging from 1.7 to 10 wt %.

3. The cleaning solution according to claim 1, wherein the alcohol compound is selected from the group consisting of $C_1$-$C_{10}$ alkyl alcohol, $C_1$-$C_{10}$ alkoxyalcohol and combinations thereof.

4. The cleaning solution according to claim 3, wherein the $C_1$-$C_{10}$ alkyl alcohol is selected from the group consisting of methanol, ethanol, propanol, isopropanol, n-butanol, sec-butanol, t-butanol, 1-pentanol, 2-pentanol, 3-pentanol, 2,2-dimethyl-1-propanol and combinations thereof.

5. The cleaning solution according to claim 3, wherein the $C_1$-$C_{10}$ alkoxyalcohol is selected from the group consisting of 2-methoxyethanol, 2-(2-methoxyethoxy)ethanol, 1-methoxy-2-propanol, 3-methoxy-1,2-propanediol and combinations thereof.

6. The cleaning solution according to claim 1, wherein the cleaning solutions are selected from the group consisting of
   a solution consisting of sulfasalazine, isopropanol and water; and
   a solution consisting of sulfanilamide, 1-pentanol and water.

7. A method of forming photoresist patterns, comprising:
   (a) forming a photoresist film by coating photoresist film on a top portion of an underlying layer formed on a semiconductor substrate;
   (b) exposing the photoresist film;
   (c) developing the exposed photoresist film using a developer; and
   (d) cleaning the resultant structure using the cleaning solution of claim 1.

8. The method according to claim 7, further comprising performing a soft-bake process before part (b) and a post-bake process after part (b).

9. The method according to claim 7, wherein an exposure source of part(b) is selected from the group consisting of KrF, ArF, VUV, EUV, E-beam, X-ray and ion-beam.

10. A cleaning solution for a photoresist pattern, the cleaning solution consisting of:
(i) water ($H_2O$) as main component;
(ii) 0.001 to 5 wt % of compounds of Formula 3 as an additive; and
(iii) at least one alcohol compound present in a range of 0.01 wt % to 10 wt %;

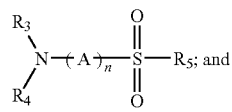

Formula 3 wherein $R_3$ and $R_4$ are selected from the group consisting of hydrogen, $C_1$-$C_{10}$ alkyl, aryl, asin, $C_1$-$C_{10}$ aminoalkyl, aminoaryl, and pyridinyl; $R_5$ is amino group, $C_1$-$C_{10}$ alkyl, aryl, asin, aminoalkyl, aminoaryl, or 5-(phenylazo)salicylic acid group; A is $C_1$-$C_5$ alkylene or $C_3$-$C_{10}$ aromatic hydrocarbon; and
n is an integer ranging from 0 to 2.

11. The cleaning solution according to claim 10, wherein the additive is present in an amount ranging from 0.3 to 5 wt % and at least one alcohol compound is present in an amount ranging from 1.7 to 10 wt %.

12. The cleaning solution according to claim 10, wherein the alcohol compound is selected from the group consisting of $C_1$-$C_{10}$ alkyl alcohol, $C_1$-$C_{10}$ alkoxyalcohol and combinations thereof.

13. The cleaning solution according to claim 12, wherein the $C_1$-$C_{10}$ alkyl alcohol is selected from the group consisting of methanol, ethanol, propanol, isopropanol, n-butanol, sec-butanol, t-butanol, 1-pentanol, 2-pentanol, 3-pentanol, 2,2-dimethyl-1-propanol and combinations thereof.

14. The cleaning solution according to claim 12, wherein the $C_1$-$C_{10}$ alkoxyalcohol is selected from the group consisting of 2-methoxyethanol, 2-(2-methoxyethoxy)ethanol, 1-methoxy-2-propanol, 3-methoxy-1,2-propanediol and combinations thereof.

15. The cleaning solution according to claim 10, wherein the cleaning solutions are selected from the group consisting of
a solution consisting of sulfasalazine, isopropanol and water; and
a solution consisting of sulfanilamide, 1-pentanol and water.

* * * * *